United States Patent
Ninomiya et al.

(10) Patent No.: US 6,407,954 B2
(45) Date of Patent: Jun. 18, 2002

(54) NONVOLATILE SEMICONDUCTOR MEMORY DEVICE

(75) Inventors: Kazuhisa Ninomiya; Mitsuru Sekiguchi, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/781,829

(22) Filed: Feb. 12, 2001

(30) Foreign Application Priority Data

Feb. 15, 2000 (JP) ........................................ 2000-036794

(51) Int. Cl.[7] .............................................. G11C 7/00
(52) U.S. Cl. .............. 365/201; 365/189.05; 365/230.08
(58) Field of Search ........................... 365/201, 230.08, 365/189.05; 714/718

(56) References Cited

U.S. PATENT DOCUMENTS 6,058,495 A * 5/2000 Lee et al. ................... 714/718

* cited by examiner

Primary Examiner—Vu A. Le
(74) Attorney, Agent, or Firm—Hutchins, Wheeler & Dittmar

(57) ABSTRACT

A nonvolatile semiconductor memory device comprises a plurality of sectors each having a plurality of memory cell arrays, a controller which responds to an address signal and a control signal to activate at least one of the sectors; and a plurality of data comparing circuits provided in the memory cell arrays, respectively, the data comparing circuits each which latches a write data to be written the respective memory cell arrays and compares the write data latched and a data read out from the respective memory cell arrays to produce a comparison result. The controller activates all of the sectors when the control signal has a first logic level regardless of levels of the address signal so that write data is written into the memory cell arrays of the sectors activated. The controller activates the sectors in sequence in response to changing levels of the address signal when the control signal has a second logic level to output the comparison results from the data comparing circuits in sequence.

16 Claims, 9 Drawing Sheets

NONVOLATILE SEMICONDUCTOR MEMORY DEVICE

BACKGROUND OF THE INVENTION

1. Field of the Invention

The present invention relates to a semiconductor memory device, in particular to nonvolatile semiconductor memory device having an automatic multi-byte write function.

2. Description of the Related Art

In a nonvolatile semiconductor memory device shown in FIG. 8, memory cell region is divided into a plurality of sectors S1, S2, ..., Sn−1 and Sn, a Y selector 2 is provided for the memory cell array 1 of each of the sectors S1, S2, ..., Sn−1 and Sn, and a logic circuit 3 for selecting each Y selector 2 is incorporated.

A sense amplifier 4 and a write circuit 5 are connected in parallel to a bit line 1a of each memory cell array 1, and data are input to and output from the sense amplifier 4 and the write circuit 5 that are connected in parallel via an I/O buffer 6. Numerals 7 are a plurality of I/O terminals provided corresponding to the I/O buffers 6.

In the nonvolatile semiconductor memory device according to related art shown in FIG. 8, in order to carry out multiple write into the plurality of sectors S1, S2, ..., Sn−1 and Sn, a plurality (4 bytes) of bit lines 1a are selected simultaneously by the logic circuit 3 based on a multi-program test mode entry signal 8, and the same data are written simultaneously to the corresponding memory cell arrays from each write circuit 5.

Now, when the multi-program is adopted in a nonvolatile semiconductor memory device as shown in FIG. 8, it is necessary after the completion of the operation to check the result of the write by a write verify test mode in order to confirm whether or not the data are written normally.

However, in the test mode it is necessary to apply a voltage of about 7V to the word lines of the memory cell arrays from an external power supply terminal that is not shown. It incurs an additional test time of 5 ns/address and results in a drawback of diluting the effect of reducing the test time.

In order to resolve the above problem possessed by the nonvolatile semiconductor memory device shown in FIG. 8, a method in which an automatic write operation is carried out, having a test after write as an on-chip incorporated function, has been proposed.

In FIG. 9 is shown a nonvolatile semiconductor memory device having the function of an automatic write operation according to related art.

The nonvolatile semiconductor memory device according to related art shown in FIG. 9 is formed by adding a data control circuit 9 and a status circuit 10 to the circuit shown in FIG. 8.

The data control circuit 9 holds write data input from the I/O buffer 6, and outputs write data to the write circuit 5 at the time of writing. At write inspection, the data control circuit 9 compares data read from the sense amplifier 4 with the write data stored in it, and outputs data (data about the result of the write check for the memory cell array 1) about whether or not they match with each other (write pass) to the status circuit 10.

The status circuit 10, with the write inspection decision data as an input, outputs pass/fail decision data that indicate whether or not successful write to the memory cell array 1 was obtained, to the I/O terminal 7 and an operation control circuit 11.

The operation control circuit 11 completes the write operation to the memory cell array 1 when the write inspection decision data for the memory cell array 1 is a pass, and controls so as to repeat a rewrite and an inspection on the rewrite to the memory cell array 1 when the decision data is a fail.

Next, the operation of the nonvolatile semiconductor memory device shown in FIG. 9 will be described. When an operation command, and subsequent data to be written and an address signal are input from the outside to the memory device, the input data are held in the data control circuit 9 from the I/O terminal 7 via the buffer 6.

When the write operation to the memory cell array 1 is started under the control of the operation control circuit 11 in this state, the write data held in the data control circuit 9 are written through the write circuit 5 to the memory cell in the sector S1, S2, ..., Sn−1 or Sn selected by the input address signal.

Next, when the write inspection operation to the memory cell array 1 is started under the control of the operation control circuit 11, the data control circuit 9 reads the write inspection data for the memory cell array 1 through the sense amplifier 4, compares the write inspection data with the write data that are stored in the data control circuit 9, and outputs data (write inspection decision data for the memory cell array 1) as to whether or not they match (write pass) to the status circuit 10.

In the meantime, the status circuit 10, with the write inspection decision data for the memory cell array 1 output from the data control circuit 9 as an input, takes the logical product of the pass/fail decision data which indicate whether or not all the memory cell arrays 1 were successfully written, and when the write to all the memory cell arrays 1 is normally completed, outputs a signal to that effect to the I/O terminal 7.

When the write inspection decision data for the memory cell arrays 1 is a pass, the operation control circuit 11 completes the write operation to the memory cell array 1, resets all the operations, and sets the relevant components to a standby state for the next operation.

When the write inspection decision data indicates a fail, the operation control circuit 11 controls the memory cell array 1 to be subjected to a rewrite of data and an inspection of the rewriting.

However, in the case of automatic write operation for the nonvolatile semiconductor memory device according to the related art shown in FIG. 9, the pass/fail decision data are output by being taken the logical product at a single I/O terminal 7. Accordingly, when a defective product is to be saved by means of redundancy, it becomes necessary to verify again as to the write operation to which memory cell array 1 was decided to be in failure.

Moreover, for the verify mode, it is necessary to apply a voltage of about 7V to the word line of the memory cell array from the terminal of an external power supply, where the test time is 5ns/address (write time) so that it results in a problem that a long time is wasted for the test.

SUMMARY OF THE INVENTION

It is the object of the present invention to provide a nonvolatile semiconductor memory device which is capable of suppressing the increase in write time due to the increase in the number of parallel write caused by the multiple write, and omitting analogous to the automatic write the time for write verify.

In order to achieve the above object, in a nonvolatile semiconductor memory device having memory cell region divided into a plurality of sectors, the nonvolatile semiconductor memory device according to the present invention makes it possible to write simultaneously write data to the memory cell arrays divided into the plurality of sectors, and output the inspection result of the write to the outside by scanning the address signals.

In a nonvolatile semiconductor memory device having memory cell arrays divided into a plurality of sectors, the nonvolatile semiconductor memory device according to this invention includes, write means for simultaneously writing write data to the memory cell arrays divided into the plurality of sectors, write inspection means for conducting write inspection as to match/mismatch between the data written to the memory cell array and the write data to be written to the memory cell array, and outputting pass/fail decision data indicating whether or not the memory cell array was successfully written, hold means for holding the pass/fail decision data for the memory cell array, and output means for outputting to the outside the pass/fail decision data arranged to correspond to each memory cell array in response to the externally input address signals.

BRIEF DESCRIPTION OF THE DRAWINGS

The above and other objects, features and advantage of the present invention will be more apparent from the following detailed description taken in conjunction with the accompanying drawings, in which.

DESCRIPTION OF THE PREFERRED EMBODIMENTS

Figure 1:
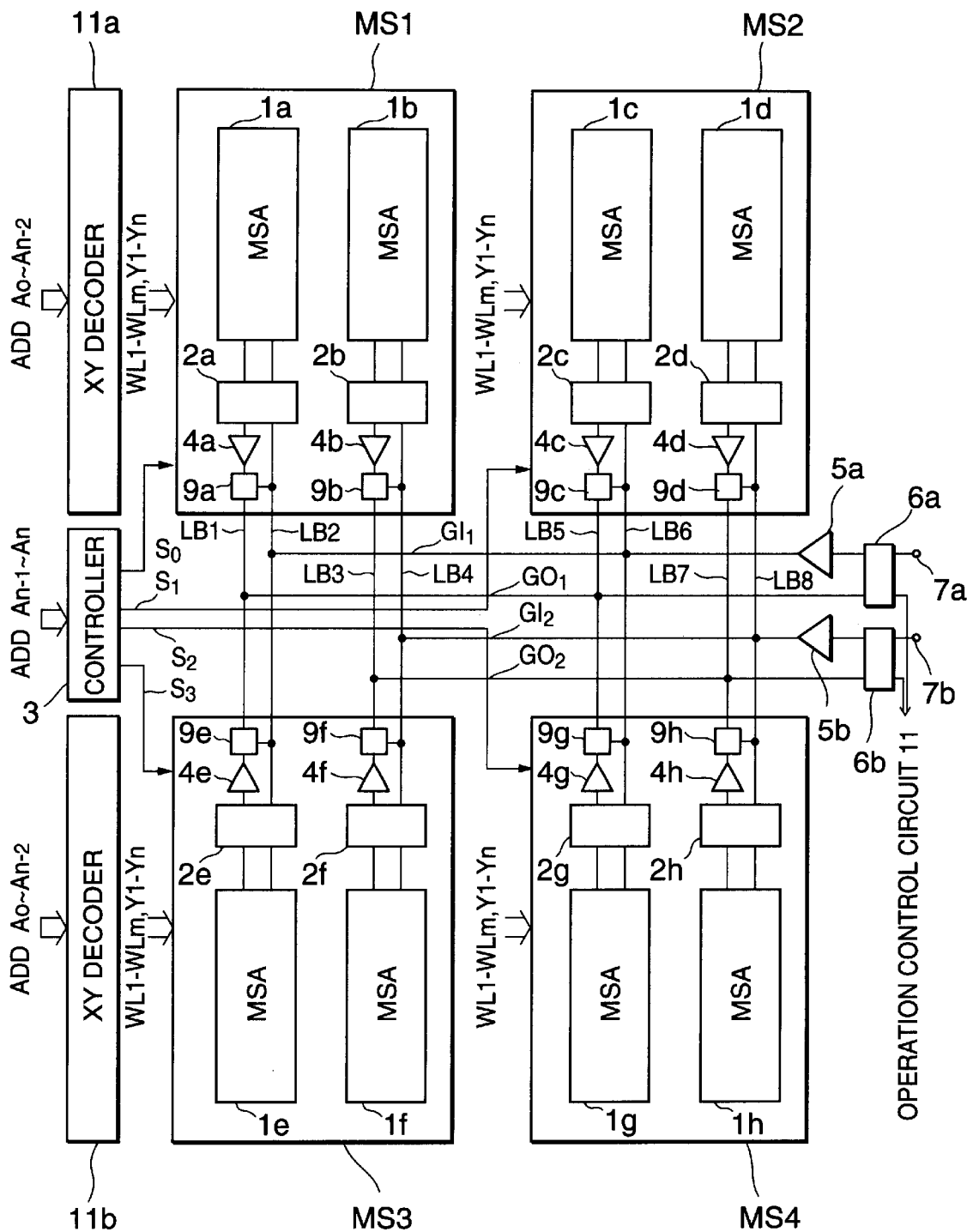
FIG. 1 is a circuit diagram showing a nonvolatile semiconductor memory device according to a first embodiment of the present invention.

FIG. 1 is a circuit diagram showing the nonvolatile semiconductor memory device according to a first embodiment of the present invention.

As shown in FIG. 1, the nonvolatile semiconductor memory device has memory sectors MS1 to MS4. XY decoders 11a, 11b control the memory sectors. The decoders 11a, 11b receive address signals A0 to An−2 and select one word line among word lines WL1 to WLm and one Y select line among Y select lines Y1 to Yn to select one memory cell of each memory cell array 1a to 1h. A controller 3 is responsive to address signals An−1, An to activate one signal among sector enable signals S0 to S3. Each of the memory sectors MS1 to MS4 is activated by the respective activated sector enable signals. Each of memory sectors MS1 to MS3 are connected to bit lines LB1 to LB4. Each of memory sectors MS2 to MS4 are connected to bit lines LB5 to LB8. The bit lines LB1, LB5 are connected to an output line GO1. The bit lines LB2, LB6 are connected to an input line GI1. The bit lines LB3, LB7 are connected to an output line GO2. The bit lines LB4, LB8 are connected to an input line GI2. The input lines I1, I2 are connected to write circuits 5a, 5b, respectively. An I/O buffer 6a is connected to an input of the write circuit 5a and the output line GO1. An I/O buffer 6b is connected to an input of the write circuit 5b and the output line GO2. The buffers 6a and 6b are connected to terminals 7a, 7b, respectively, and outputs their outputs into an operation control circuit 11. Since the structure of each memory sector mS1 to MS4 is substantially identical to each other except sector enable signals receiving at the sectors, respectively, we explain the memory sector MS1 mainly. The explanation of the sectors MS2 to MS 4 is omitted.

Figure 2:
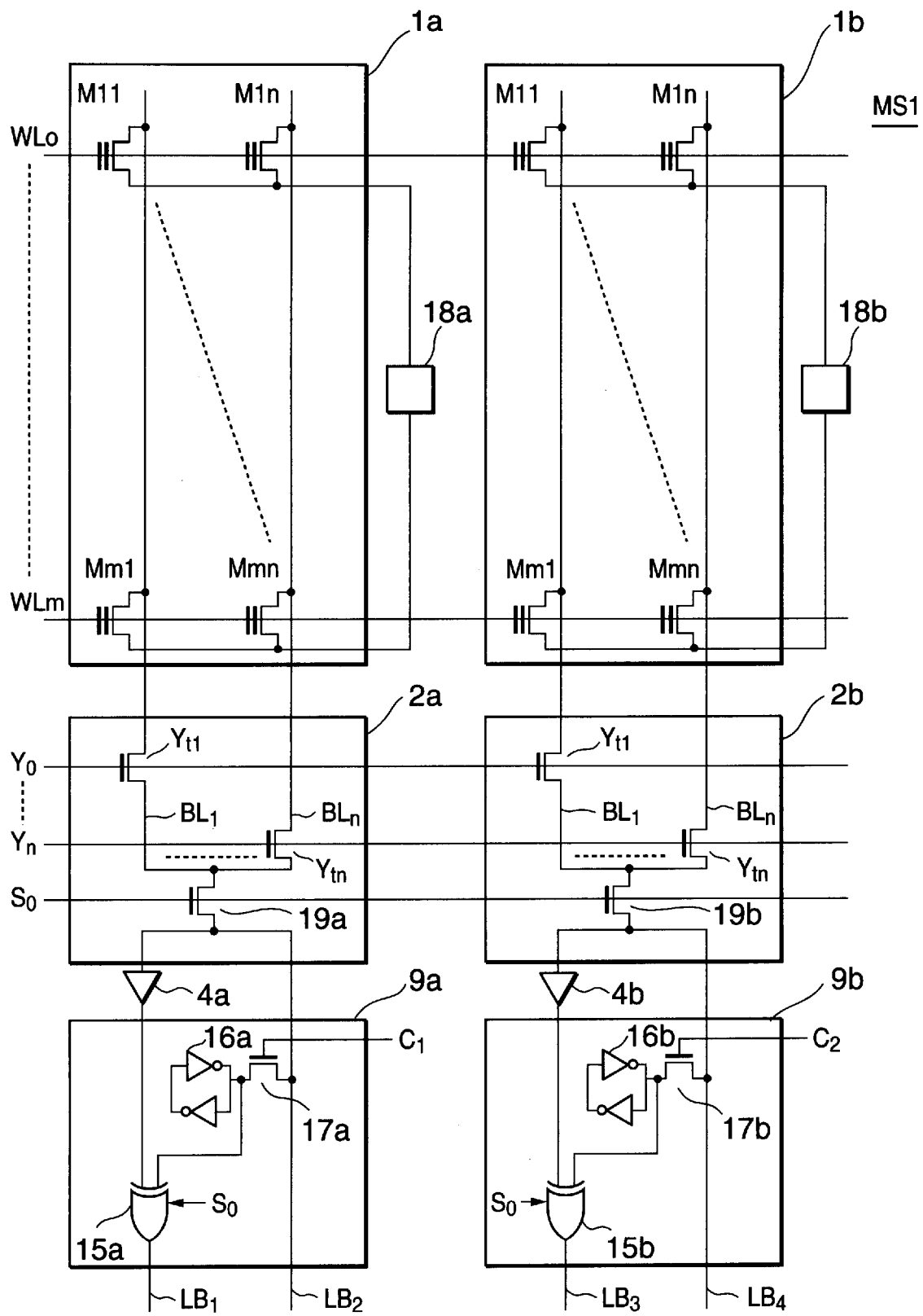
FIG. 2 is a circuit diagram of a sector MS1 of the device shown in FIG. 1.

FIG. 2 is a circuit diagram of the sector MS1 shown in FIG. 1. The sector MS1 includes memory cell arrays 1a, 1b, Y-selectors 2a, 2b, sense amplifiers 4a, 4b, data control circuits 9a, 9b, and source voltage supply circuits 18a, 18b. Each of memory cell arrays 1a, 1b has non-volatile memory cells M11 to Mmn (m,n: integer) arranged in a matrix. Memory cells on a line in a row direction, for example, cells M11 to M1n are connected to a single word line, for example, WL1. Bit lines BL1 to BLn are connected to the respective memory cells. For example, the drains of memory cells M11 to Mm1 are connected to bit line BL1. The sources of memory cells M11 to Mmn are connected to the source voltage supply circuit 18a.

The Y-selectors 2a, 2b each is connected to Y-select lines Y1 to Yn and receives the sector enable signal S0. In the Y-selector 2a, 2b each, the Y-select lines are connected to gates of the respective select transistors Yt1 to Ytn. The sector enable signal S0 is input to a gate of transistor 19a, 19b. The select transistor Yt1 to Ytn each has a current path between the respective bit line and the transistor 19a. The data control circuits 9a, 9b each has exclusive circuits 15a, 15b, latch circuits 16a, 16b, and gate circuits 17a, 17b. The gate circuits 17a, 17b each is connected to bit lines LB2, LB4 each. The bit lines LB2, LB4 are connected to the transistors 19a, 19b, respectively. The gate circuits 17a, 17b are connected to the latch circuits 16a, 16b, respectively, so that the latch circuits 16a, 16b latches data on the bit lines LB2, LB4 when control signal C1, C2 are activated, respectively. The latched data in the latch circuits 16a, 16b and the output from the sense amplifier 4a, 4b are input to exclusive circuits 15a, 15b, respectively. The output of the exclusive circuits 15a, 15b are connected to the bit lines LB1, LB3, respectively. The exclusive circuits 15a, 15b each can output in three states that are logic high and low levels and floating level. That is, when the signal S0 is a low level, the exclusive circuits 15a, 15b sets their output in a floating state. When the signal S0 is a high level, the exclusive circuits outputs logic high or logic low level as coincident or in-coincident result.

Exclusive circuits 15a, 15b and Y-select transistors 19a, 19b in the sectors MS2 to MS4 receives the sector enable signals S1 to S3, respectively in place of the signal S0.

Figure 3:
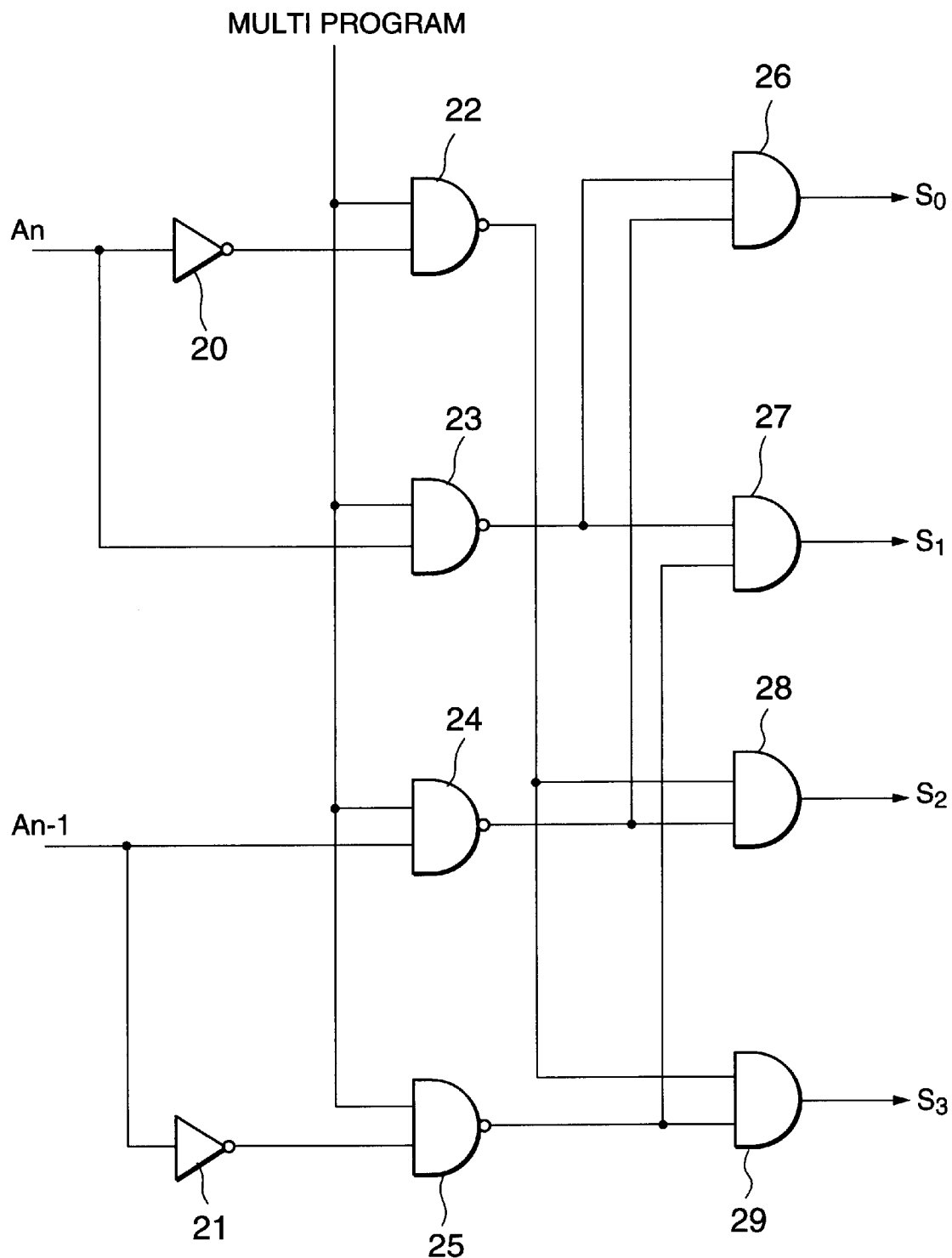
FIG. 3 is a circuit diagram of a controller shown in FIG. 1.

FIG. 3 is a circuit diagram of the controller 3 shown in FIG. 1. The controller 3 has inverters 20, 21 and NAND circuits 22 to 39. When Multi Program signal has a logic high level, the signals S0 to S3 has logic high levels regardless of levels of address signals An and An−1. In such condition that Multi Program signal has a logic low level, when address signals An and An−1 are (L,L), (L,H), (H,L), and (H,H), the signals S0, S1, S2, and S3 become (H,L,L,L), (L,H,L,L), (L,L,H,L), and (L,L,L,H), respectively. It is noted that "L" means "a logic low level" and "H" means "a logic high level". When Sector enable signal has a logic high level, the respective sector is activated to access the selected memory cells in it with I/O buffers.

The nonvolatile semiconductor memory device according to first embodiment of this invention shown in FIG. 1, uses the write circuit 5a and 5b in common to memory cell arrays 1a, 1c, 1e and 1g and 1b, 1d, 1f and 1h, respectively and writes write data from the write circuits 5a and 5b simultaneously to all memory cell arrays 1a to 1h.

The data control circuit 9 inputs write information for the memory cell array 1 via a sense amplifier 4, conducts write inspection as to match/mismatch with the write data to be written to the memory cell arrays 1 based on the received information, outputs the pass/fail decision data for the memory cell arrays 1.

Moreover, in order to output the pass/fail decision data to the outside as time series data corresponding to the memory cell arrays in response to externally input address signals, the memory cell region divided into a plurality of sectors are divided into two systems and a write circuit 5 is provided for each system, and write data are written simultaneously to all memory cell arrays 1 via a selected word line with the system as a unit.

Furthermore, the bit lines are sequentially activated by appropriately selecting time sequentially the Y selectors 2.

With this constitution, the memory device is controlled so as to input write data from the write circuit 5 simultaneously to all memory cell arrays with the system as a unit, by appropriately selecting the word lines and the bit lines time sequentially from the operation control circuit 11. In the meantime, the device externally outputs the pass/fail decision data for all memory cell arrays in sequence, in response to externally input address signals, by time sequentially selecting the Y selectors 2 based on the control from the operation control circuit 11.

Figure 4:
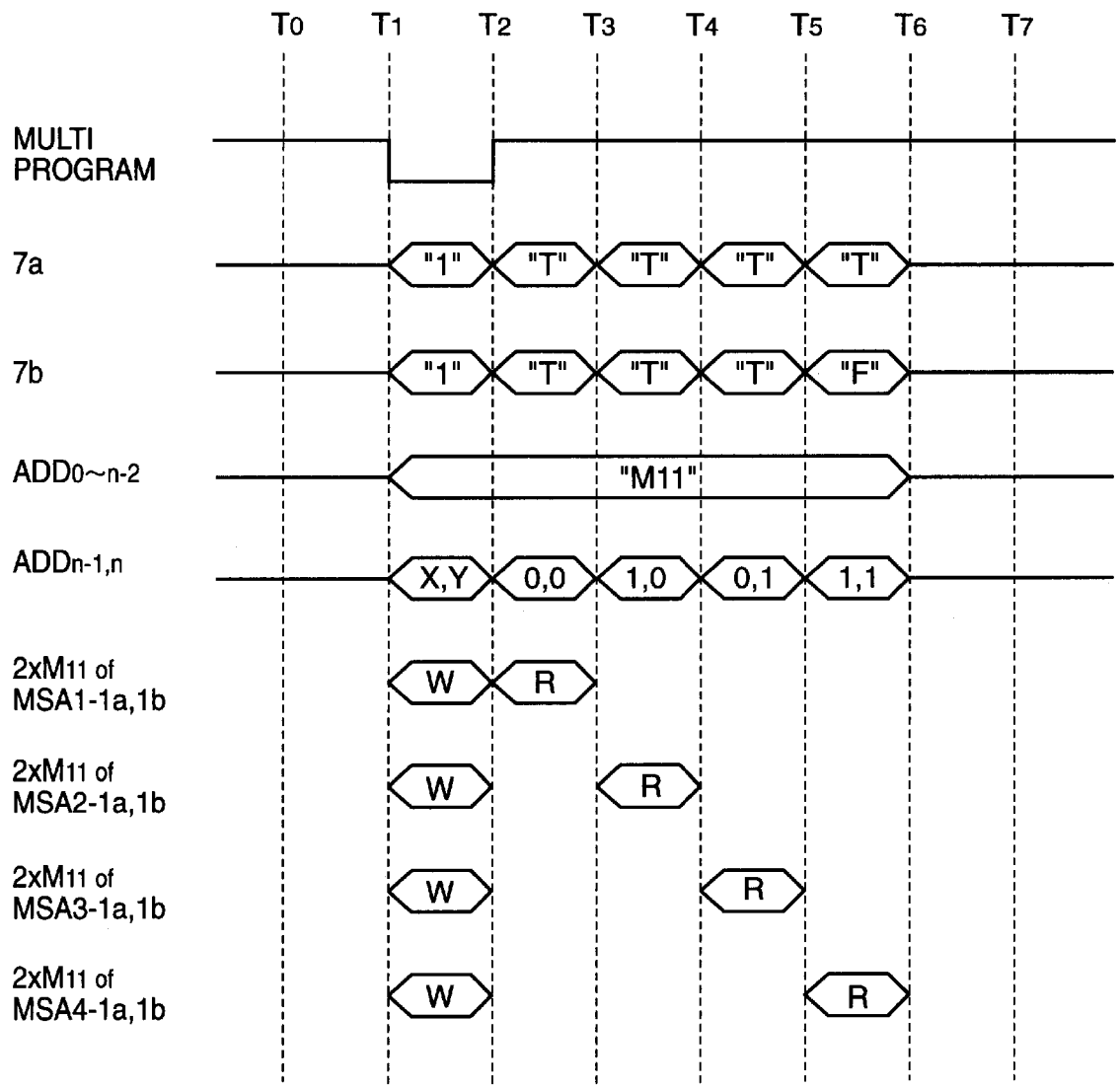
FIG. 4 is a timing chart of the device shown in FIG. 1.

Next, the operation of the nonvolatile semiconductor memory device according to the first embodiment of the present invention will be described with using FIG. 4. It is assumed that memory cells M11 of memory cell arrays 1a and 1b of sectors MS1 to MS4 each are selected and all of the memory cells M11 are written the data "1".

First, the memory device will be brought to test mode based on a command from the operation control circuit 11.

Subsequently, when the operation control circuit 11 produce a command so that the word line WL1 and the bit lines BL1 is selected by selecting the select line Y0 of the Y selectors 2a to 2h. At this time, Multi Program signal changes from high level to low level. The sector signals S0 to S3 are therefore activated so that all the sectors MS1 to MS4 are activated. Then, in response to a command, write data are inputted to terminals 7a, 7b and written simultaneously to all memory cells M11 of memory cell arrays 1a to 1h through the write circuits 5a, 5b and I/O buffers 6a, 6b. The write voltages for the memory cells are set by the write circuits 5a, 5b and the source voltage supply 12. circuits 18a, 18b. At that time, the control signals C1, C2 of a pulse signal are inputted to the transistors 17a, 17b and the write data are held by the latches 16a, 16b in the data control circuits 9a to 9h as shown at period between T1 and T2 in FIG. 4.

Next, the write inspection operation for the memory cells M11 is conducted. The XY decoders 11a, 11b sustain the address signals A0 to An−2 to keep selecting the word line WL1 and the select line Y1. All the memory cells M11 of memory cell arrays 1a to 1h are selected to be read out. Multi Program signal changes low level to high level.

At period between T2 and T3, the only signal S0 is activated and Data stored in the selected memory cells M11 in memory sector MS1 are read out and transfers into the data control circuits 9a, 9b through the transistors 19a, 19b and sense amplifiers 4a, 4b. In the data control circuits 9a, 9b, the exclusive circuits 15a and 15b compare the read out data from the memory cells M11 and the latched data in the latch 16a, 16b, respectively and outputs the match/mismatch result to the bit lines LB1, LB3. At that time, since the signals S1 to S3 are inactive, the exclusive circuits in the data control circuits 9c to 9h set their outputs in floating level. After the data control circuits 9a, 9b conduct write inspection to check whether the write data read out from the memory cell M11 is coincident with the latched data in the latch, the match/mismatch result data are transferred from the data control circuits 9a, 9b to the operation control circuit 11 via the I/O buffers 6a, 6b and the output lines GO1, GO2. It is noted that "T" in FIG. 4 means data match and "F" in FIG. 4 means data mismatch. Thereafter, in sequence, the match/mismatch result data are transferred from the control circuits of sectors MS2 to MS4 into the operation control circuit 11 via the I/O buffers 6a, 6b, by changing the address n−1, n as shown in FIG. 4.

When the operation control circuit 11 detects that the write to all memory cell arrays 1 do not complete normally, the operation control circuit 11 conducts to write the write data to the memory cell arrays failed until the write for all memory cell arrays 1a to 1h is completed normally.

It may be available to provide latch circuits to latch the output of the exclusive circuits 15a, 15b regarding the sectors MS1 to MS4 to hold the pass/fail decision data for the memory cell array 1a to 1h until the completion of the test mode.

When write for the memory cell arrays 1a to 1h is completed normally, the operation control circuit 11 outputs the sector address signals S0 to S3 into the logic circuit 3 to select sequentially sectors MS1 to MS4. The pass/fail decision data for the memory cell array 1a to 1h held in the data control circuits 9a to 9h are outputted to the outside from the I/O terminal 7.

In the above, the timing at which the operation control circuit 11 reads the pass/fail decision data for memory cell arrays is set at the time when the write to the memory cell arrays 1 is normally completed, but it may be set to be read in the order in which write to the memory cell array 1 is completed normally.

As in the above, according to this embodiment of the invention, the decision result of write inspection for the memory cell arrays is output to the outside by scanning the address signals. Accordingly, it is possible to suppress the increase in the write time due to the increase in the number of parallel writing caused by multiple write, or more specifically, due to the increase in the installation number of memory cell arrays divided into a plurality of sectors. Moreover, analogous to the automatic write, it is possible to omit the time for write verify by outputting the pass/fail decision data for the memory cell arrays to the outside in time sequential arrangement corresponding to the memory cell arrays. Furthermore, this method allows automatic multiple write for plural sectors, and has an advantage of reducing the test time for a flash memory or the like.

Figure 5:
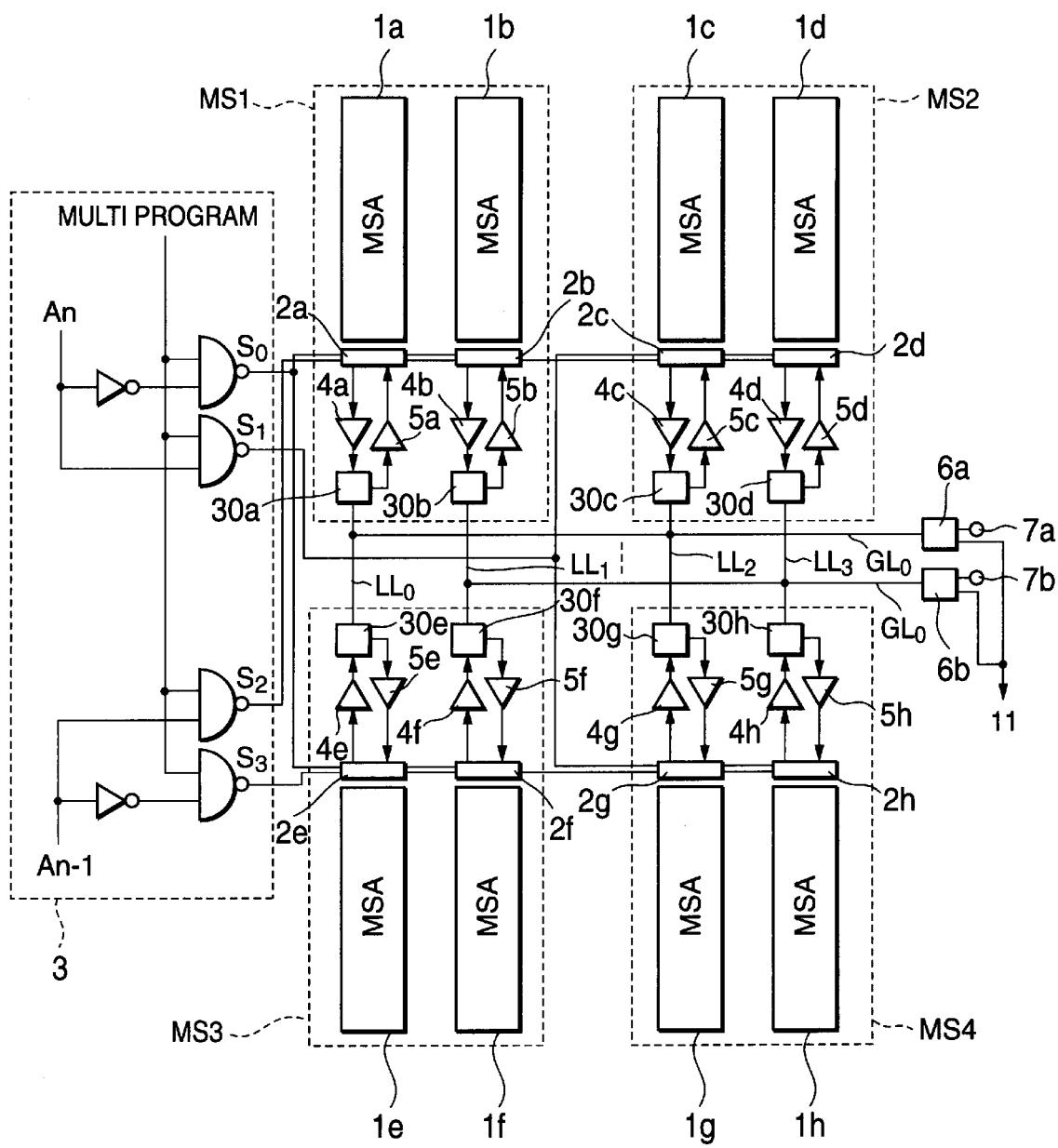
FIG. 5 is a circuit diagram showing the nonvolatile semiconductor memory device according to a second embodiment of the present invention.

FIG. 5 is a circuit diagram of the nonvolatile semiconductor memory device according to a second embodiment of the present invention.

The nonvolatile semiconductor memory device shown in FIG. 5 is provided with write circuits 5a to 5h, sense amplifiers 4a to 4h, and data control circuits 9a to 9h for each of memory cell arrays 1a to 1h. The data control circuits has functions of the write inspection means and the hold means. Write data from each of write circuits 5a to 5h are written simultaneously to all memory cell arrays 1a to 1h.

Moreover, the data control circuits 9a to 9h each has latch means to hold the pass/fail decision data for the memory cell arrays 1a to 1h until the completion of the test mode.

Furthermore, analogous to the first embodiment, this memory device is constructed so as to output to the outside the pass/fail decision data for the memory cell arrays held in the data control circuits 9a to 9h as time sequential data arranged corresponding to the memory cell arrays 1a to 1h each by sequentially changing the address signals for respective sectors S1 to S2.

The structure of the memory device according to the second embodiment is explained with using FIG. 5. The explanation of the same structure with the memory device according to the first embodiment is omitted.

The input/output bus line GL0 is connected between the I/O buffer 6a and the data control circuits 30a, 30c, 30e and 30g. The input/output bus line GL1 is connected between the I/O buffer 6b and the data control circuits 30b, 30d, 30f and 30h. The write circuits 5a to 5h are connected between the data control circuits 30a to 30h and the Y-selectors 2a to 2h. The Y-selectors 2a to 2h each is connected to the respective select lines S0 to S3.

Figure 6:
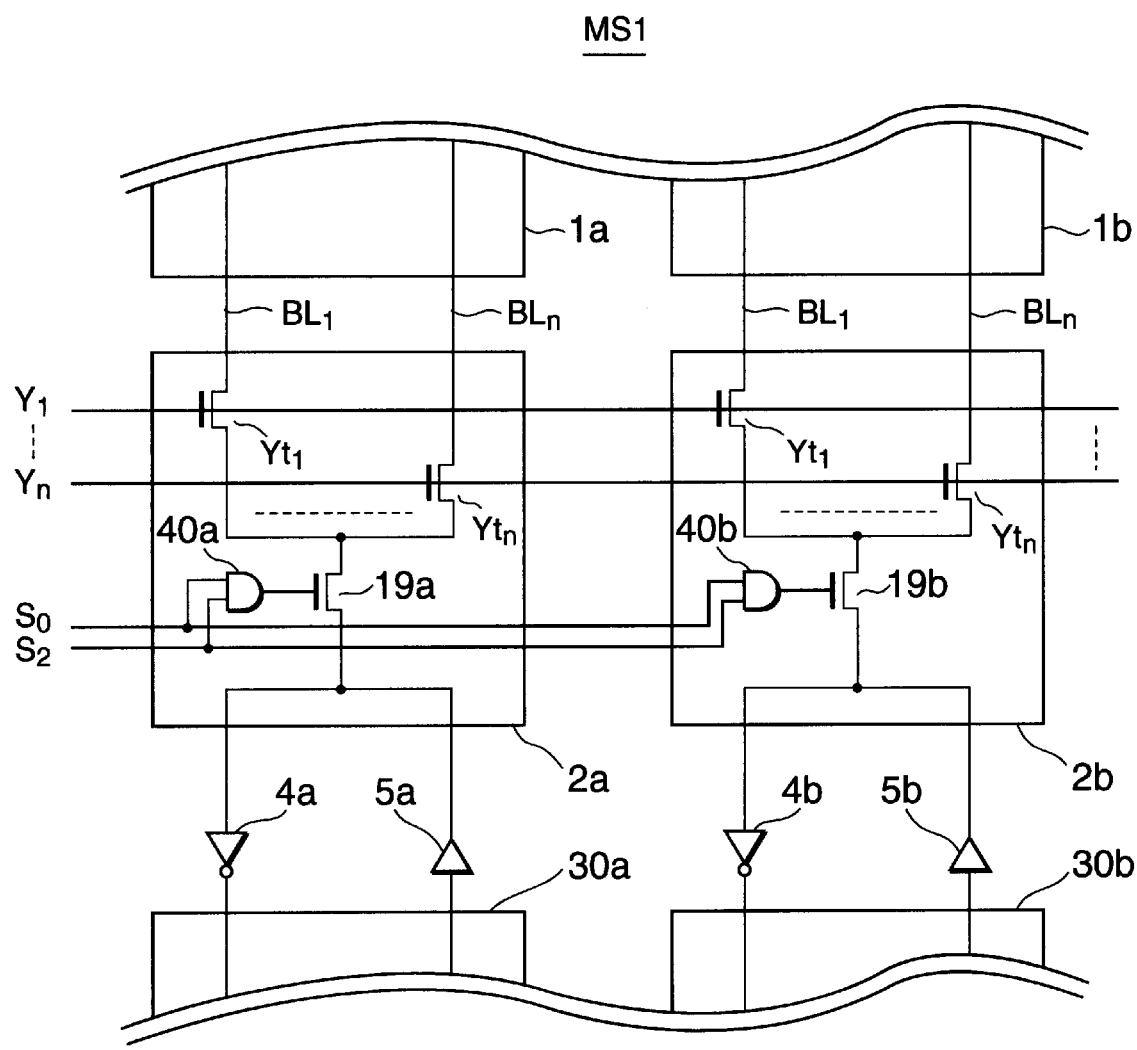
FIG. 6 is a circuit diagram of a sector MS1 of the device shown in FIG. 5.

FIG. 6 illustrates a circuit diagram of Y-selectors 2a and 2b shown in FIG. 5. However, the selection movement to select sectors MS1 to MS4 in sequence is substantially the same. That is, responding to the changing the addresses An, An−1, the sectors MS1 to MS4 are activated in sequence. The explanation is omitted for the Y-selectors 2c to 2h because those structures are substantially same to those of Y-selectors 2a to 2b, except that And-gates 40a, 40b of sectors MS2, MS3 and MS4 receive S1 and S2, S0 and S3, and S1 and S3 in place of S0 and S2.

Figure 7:
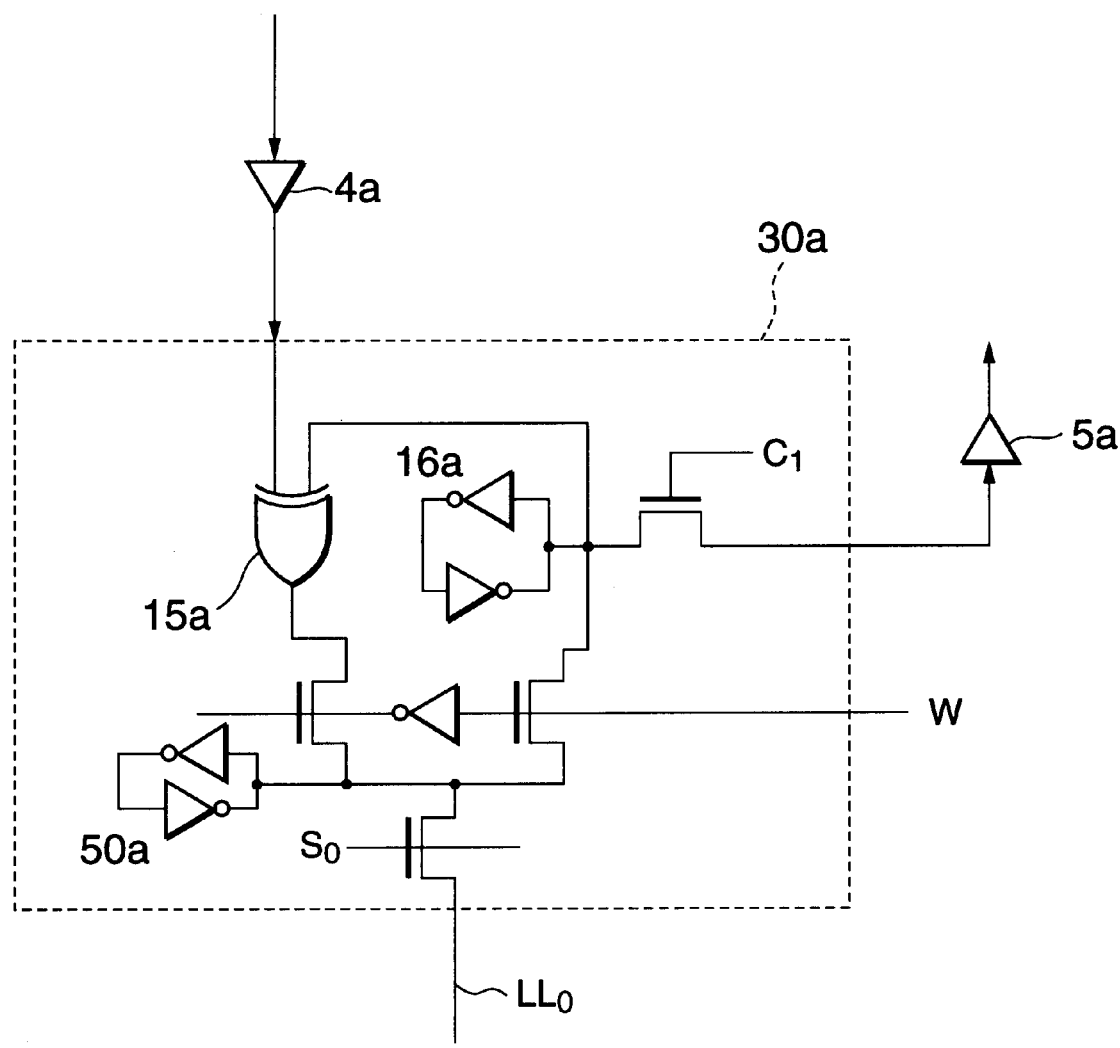
FIG. 7 is a circuit diagram of a data control circuit of the device shown in FIG. 5.
Figure 8:
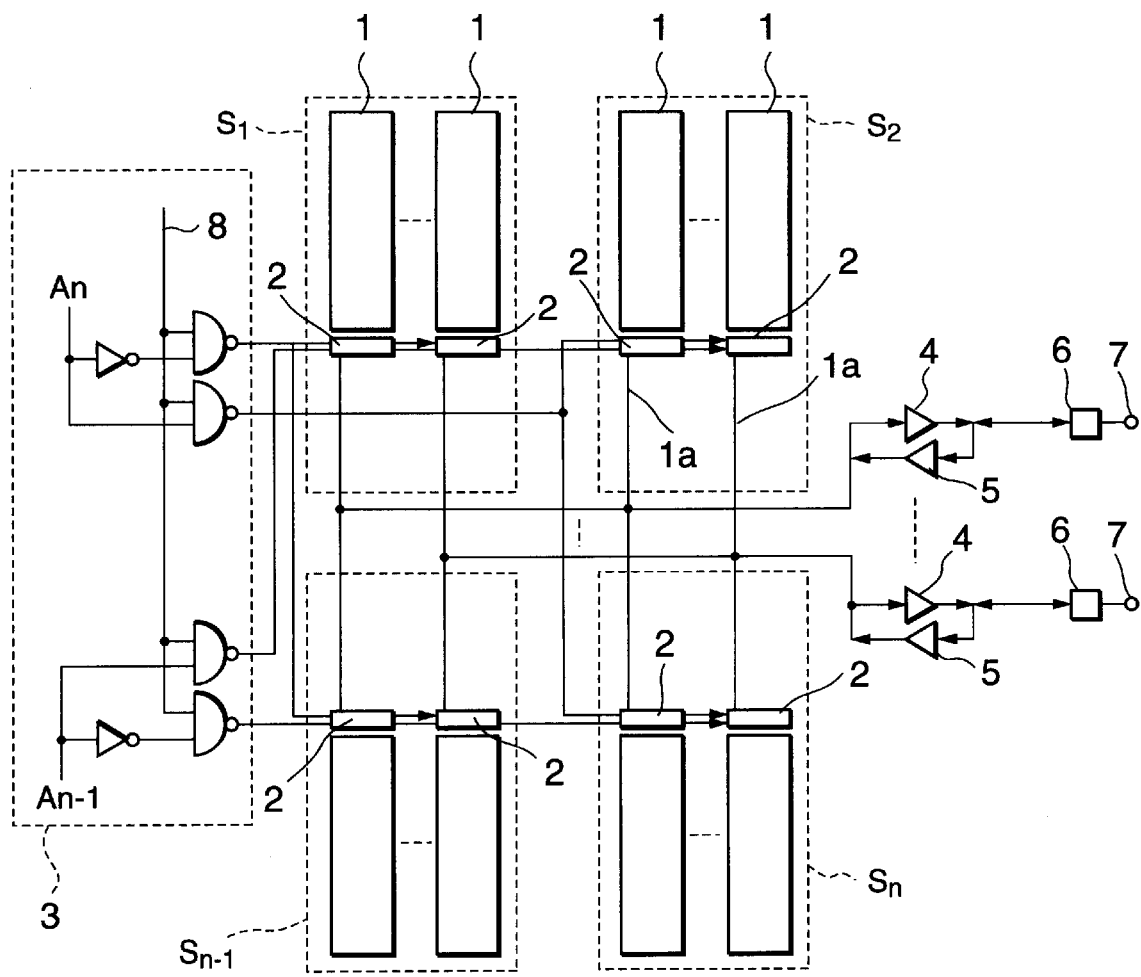
FIG. 8 is a circuit diagram showing a nonvolatile semiconductor memory device according to related art.
Figure 9:
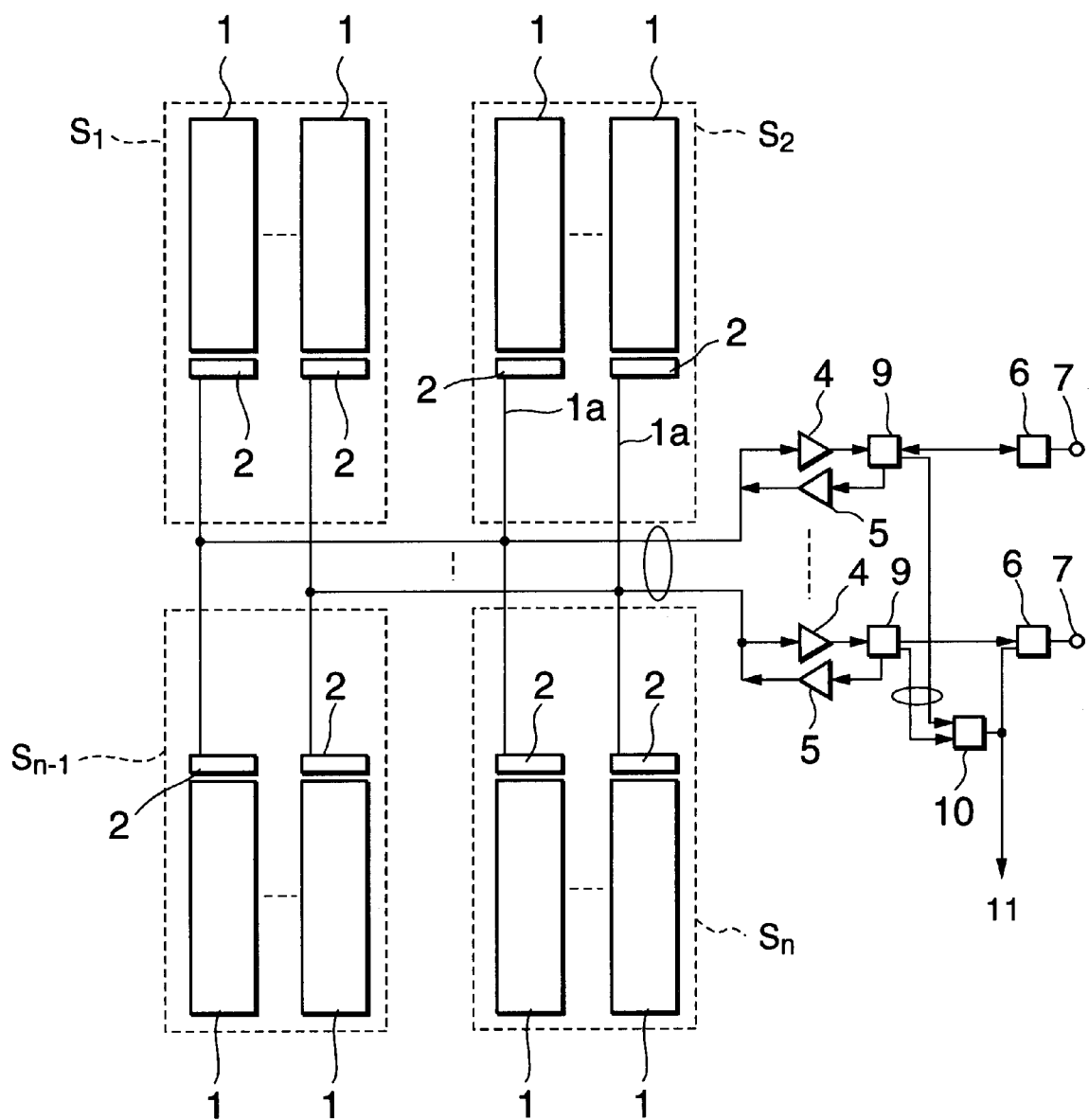
FIG. 9 is another circuit diagram showing a nonvolatile semiconductor memory device according to the related art.

FIG. 7 illustrates a circuit diagram of data control circuit 30a shown in FIG. 5. The data control circuit 30a has a first transistor coupled to a line LL0 and receiving a sector select signals S0 and S2. A second transistor is coupled between a latch circuit 16a and the first transistor and receives a write signal. During a write operation, the write signal becomes a high level so that the second transistor turns ON. A third transistor is coupled between the latch circuit 16a and the write circuit 5a and receives a pulse signal C1. When a write data is written into a selected memory cell, the pulse signal C1 is generated to transfer the write data into the write circuit 5a. An exclusive circuit 15a has input nodes coupled to the latch circuit 16a and the sense amplifier 4a. A fourth transistor is coupled between the output node of the exclusive circuit 15a and the first transistor and receives an inverted signal of the write signal. The fourth transistor turns OFF during the write operation and ON during a read operation. During the read operation, the first transistor turns OFF. A second latch circuit 50a is coupled to the connecting point of the first and fourth transistors to latch the match/mismatch result data outputted from the exclusive circuit 15a. The explanation is omitted for the data control circuits 30b to 30h because those structures are substantially same to that of the data control circuit 30a, except that the data control circuits 30b to 30h receive respective signals among S0, S1, S2 and S3.

The structures of memory cell arrays 1a to 1h according to the second embodiment is substantially the same with those of memory cell arrays 1a to 1h according to the first embodiment. Moreover, the XY decoders 11a, 11b shown in FIG. 1 are attached to the memory device shown in FIG. 5.

Next, the operation of the nonvolatile semiconductor memory device according to the second embodiment of the present invention will be described. First, the memory device is brought to the test mode based on a command from the operation control circuit 11.

Subsequently, the word line and the bit line are selected based on a command from the operation control circuit 11. In response to an operation command, write data are input from the external terminals 7a, 7b. The input data are written simultaneously to the corresponding memory cells of memory cell arrays 1a to 1h through respective write circuits. At that time, the write data are held in the latch circuits 16a each of the data control circuits 30a to 30h.

Next, the write inspection for the memory cell arrays 1a to 1h starts, the data control circuits 30a to 30h receive the data read out from the memory cell arrays 1a to 1h via the sense amplifiers 4a to 4h. Each of the circuits 30a to 30h conducts match/mismatch comparison between the data read out from the memory cells and the write data in the latch circuits 16a and outputs pass/fail decision data for the memory cell arrays 1a to 1h. Each of the circuits 30a holds the decision data in the latch circuit 50a.

When the write to all memory cell arrays do not complete normally, the operation control circuit 11 repeats data write to the failed memory cell arrays and read of write inspection data for these memory cell arrays once again, and stops the series of write operation upon normal completion of write operation for all memory cell arrays 1.

In this case, the data control circuits 30a to 30h holds the pass/fail decision data for the memory cell arrays until the completion of the test mode.

When the write to all the memory cell array is completed normally, the operation control circuit 11 outputs a sector address signal to the logic circuit 3, and the logic circuit 3 selects sequentially a plurality of Y selectors to read the pass/fail decision data for all memory cell arrays held in the data control circuit, and outputs the decision data to the outside from the I/O terminals 7a, 7b as time sequential data.

In the above, the timing at which the operation control circuit 11 reads the decision result of the write inspection for the memory cell arrays is set at the time when the write for all memory cell arrays is completed in normal fashion. However, the timing may be set in such a manner that it is read in the order normal write is completed for individual memory cell array.

As described in the above, In nonvolatile semiconductor memory devices having memory cell region divided into a plurality of sectors MS1, MS2, . . . , MSn−1 and MSn, the nonvolatile semiconductor memory devices according to the present invention shown in FIG. 1 and FIG. 5 are arranged to be capable of writing simultaneously write data to memory cell arrays 1 that are divided into the plurality of sectors MS1, MS2, . . . , MSn−1 and MSn, and outputting to the outside the result of the write inspection by scanning the address signals.

More specifically, in nonvolatile semiconductor memory devices having memory cell region divided into a plurality of sectors MS1,MS2, . . . , MSn−1 and MSn, the nonvolatile semiconductor memory devices according to the present invention are provided with write means 5 for simultaneously writing write data to the memory cell arrays 1 divided into the plurality of sectors MS1, MS2, ..., MSn–1 and MSn, write inspection means for conducting write inspection as to match/mismatch between the data written to the memory cell arrays 1 and the write data to be written to memory cell arrays 1, and for outputting pass/fail decision data indicating whether or not the memory cell arrays 1 are successfully written, hold means for holding the pass/fail decision data for the memory cell arrays 1, and output means 3 and 11 for outputting the pass/fail decision data arranged corresponding to each memory cell array, to the outside in response to externally input address signals. Here, in the case of FIG. 1, a data control circuit 9 is employed as a circuit having both functions of the write inspection means and the hold means.

In the nonvolatile semiconductor memory device according to the present invention as shown in FIG. 1, the write means 5 and the hold means are provided for each memory cell array, uses the write means 5 in common to all memory cell arrays 1, and write data from the write means 5 are written simultaneously to all memory cell arrays 1.

In the nonvolatile semiconductor memory device according to the present invention as shown in FIG. 5, the write means 5, the write inspection means and the hold means are provided for each memory cell array 1, and write data from each write means 5 are written simultaneously to all memory cell arrays 1 by writing the write data to each individual memory cell array 1.

Moreover, in the nonvolatile semiconductor memory devices according to the invention as shown in FIG. 1 and FIG. 5, the hold means is so constructed as to hold the pass/fail decision data for the memory cell array 1 until the completion of the test mode.

Besides, in the nonvolatile semiconductor memory devices of the invention as shown in FIG. 1 and FIG. 5, the output means 3 and 11 are constructed so as to output the pass/fail decision data held in the hold means to the outside for each memory cell array, by sequentially inputting the address signal for each sector MS1, MS2, ..., MSn–1 and MSn.

As described in the above, according to this invention in which a nonvolatile semiconductor memory device having memory cell region is divided into a plurality of sectors MS1, MS2, ..., MSn–1 and MSn, write data are written simultaneously into the plurality of sectors MS1, MS2, ..., MSn–1 and MSn, and the result of write inspection is output to the outside by scanning the address signals. Accordingly, it is possible to suppress the increase in the number of parallel writings due to multiple write, or more specifically, to suppress the increase in the write time due to the increase in the installation number of memory cell arrays that are divided into a plurality of sectors. Moreover, since the result of the write inspection can be output to the outside as arranged corresponding to the memory cell arrays similar to the multiple write, it is possible to omit the time for write verify.

Moreover, in a nonvolatile semiconductor memory device having memory cell region divided into a plurality of sectors MS1, MS2, ..., MSn–1 and MSn, the present invention has the write means 5 for writing write data simultaneously into the plurality of sectors MS1, MS2, ..., MSn–1 and MSn, the write inspection means for conducting write inspection as to match/mismatch between the data written to the memory cell arrays 1 and the write data to be written to the memory cell arrays 1, and outputting pass/fail decision data for the memory cell arrays 1, the hold means for holding the pass/fail data for the memory cell arrays 1, and means 3 and 11 for outputting to the outside the pass/fail decision data for the memory cell arrays 1 in response to the externally input address signals. Accordingly, in addition to obtaining the effect mentioned above, it is possible to conduct automatic multiple write for plural sectors by the application of the present invention without introducing a drastic change to the existing configuration, thereby reducing the test time for a flash memory or the like.

Moreover, the nonvolatile semiconductor memory device according to this invention may be configured, as shown in FIG. 1, so as to provide the write inspection means and the hold means for each memory cell array 1, where the write means 5 is used in common to all memory cell arrays, and write data from the write means 5 are written simultaneously to all memory cell arrays 1. Alternatively, it may be arranged, as shown in FIG. 5 of the nonvolatile semiconductor memory device according to this invention, so that the write means 5, the write inspection means and the hold means are provided for each memory cell array 1, and write data from each write means 5 are written simultaneously to all memory cell arrays 1 by writing the write data from each write means 5 to each memory cell array 1. Accordingly, this invention may be applied corresponding to the configuration of the memory cells, and the versatility of the invention can be expanded.

Moreover, in the nonvolatile semiconductor memory devices according to this invention as shown in FIG. 1 and FIG. 5, the hold means is arranged so as to hold the pass/fail decision data for the memory cell array 1 until the completion of the test mode, so that the system is capable of coping effectively with the situation even if an accident should happen in the midst of the operation.

Furthermore, in the nonvolatile semiconductor memory devices according to this invention as shown in FIG. 1 and FIG. 5, the output means 3 and 11 are configured so as to output to the outside the pass/fail decision data held in the hold means as arranged corresponding to the memory cell arrays 1 by sequentially inputting the address signals for each sector MS1, MS2, ..., MSn–1 and MSn. Accordingly, it is possible to output to the outside the pass/fail decision data as time series data for each memory cell array 1, so that when a defective product is saved by means of redundancy, write operation to which memory cell array 1 was decided to be in failure can be determined quickly and accurately.

According to this invention, the decision result of the write inspection for the memory cell arrays is output to the outside by scanning the address signals. Accordingly, the increase in the write time due to the increase in the number of parallel writes caused by the multiple write, and more specifically, due to the increase in the installation number of the memory cell region that is divided into a plurality of sectors, can be suppressed, and analogous to the case of the automatic write, the time for write verify can be omitted by outputting to the outside the pass/fail decision data for the memory cell arrays in time sequential fashion arranged corresponding to the memory cell arrays.

It is apparent that the present invention is not limited to the above embodiments, but may be modified and changed without deviating from the scope and spirit of the invention.

What is claimed is:

1. A nonvolatile semiconductor memory device comprising:

a plurality of sectors each having a plurality of memory arrays;

a write circuit which simultaneously writes write data to said memory arrays of said sectors each;

a write inspection circuit which conducts write inspection as to match/mismatch between data written to said memory cell arrays and said write data, and which outputs pass/fail decision data indicating whether or not writing to the memory cell arrays was successful; and an output circuit which outputs to the outside said pass/fail decision data that are arranged corresponding to each memory cell array in response to externally input address signals, wherein said write inspection circuit comprises a latch circuit which latches the pass/fail decision data for said memory cell array.

2. The device as claimed in claim 1, wherein said output circuit outputs said pass/fail decision data held in said latch circuit by sequentially inputting said address signal for each sector.

3. A nonvolatile semiconductor memory device comprising:

a plurality of sectors each having a plurality of memory cell arrays;

a controller which responds to an address signal and a control signal to activate at least one of said sectors; and a plurality of data comparing circuits provided in said memory cell arrays, respectively, said data comparing circuits each which latches a write data to be written the respective memory cell arrays and compares said write data latched and a data read out from the respective memory cell arrays to produce a comparison result;

wherein said controller activates all of said sectors when said control signal has a first logic level regardless of levels of said address signal so that write data is written into said memory cell arrays of said sectors activated;

said controller activates said sectors in sequence in response to changing levels of said address signal when said control signal has a second logic level to output the comparison results from said data comparing circuits in sequence.

4. A semiconductor memory device comprising:

a first data line; and a first and a second memory sector coupled in common to said data line;

said first memory sector including:

a plurality of first memory cells;

a first latch circuit coupled to said first data line to temporarily store a data that is transferred through said first data line to be written into a selected one of said first memory cells; and a first comparison circuit comparing the data stored into said first latch circuit with a data read out from the selected one of said first memory cells;

said second memory sector including:

a plurality of second memory cells;

a second latch circuit coupled to said first data line to temporarily latch a data that is transferred through said first data line to be written into a selected one of said second memory cells; and a second comparison circuit comparing the data stored into said second latch circuit with a data read out from the selected one of said second memory cells.

5. The device as claimed in claim 4, further comprising:

a second data line coupled to in common to said first and second comparison circuits, outputs of said first and second comparison circuits being transferred onto said second data line in sequence.

6. The device as claimed in claim 5, wherein a data to be written is transferred through said first data line simultaneously to said first and second memory sectors so that said first and second latch circuits store the same data as each other.

7. The device as claimed in claim 6, wherein said first memory sector further includes a first sector selection transistor coupled between said first data line and said first memory cells, and said second memory sector further includes a second sector selection transistor coupled between said first data line and said second memory cells, said first and second sector selection transistors being activated simultaneously so that said data to be written is written into selected ones of said first and second memory cells.

8. The device as claimed in claim 4, wherein said first memory sector further includes a first selection gate and said second memory sector further includes a second selection gate, said first selection gate being coupled between said first data line and each of said first data latch circuit and said first comparison circuit, and said second selection gate being coupled between said first data line and each of said second latch circuit and said second comparison circuit.

9. The device as claimed in claim 8, wherein said first and second gates are activated simultaneously when a data to be written is transferred through said first data line so that said data to be written are written into selected ones of said first and second memory cells, and said first and second selection gates being activated in sequence when outputs of said first and second comparison circuits are derived so that the outputs of said first and second comparison circuits appear on said first data line in sequence.

10. The device as claimed in claim 9, wherein said first memory sector further includes a third latch circuit temporarily storing the output of said first comparison circuit and said second memory sector further includes a fourth latch circuit temporarily storing the output of said second comparison circuit.

11. A semiconductor memory device comprising:

a first memory sector including a plurality of first memory cells and a first inspection circuit producing a first signal indicative of whether or not a data write operation has been properly performed on a selected one of said first memory cells;

a second memory sector including a plurality of second memory cells and a second inspection circuit producing a second signal indicative of whether or not a data write operation has been properly performed on a selected one of said second memory cells;

a control circuit supplied with a first set of address signals and a second set of address signals, said control circuit responding to said first set of address signals to select one of said first and second memory sectors and responding to said second set of address signals to select at least one of the memory cells contained in the selected one of said first and second memory sectors, said control circuit being further supplied with a multi-program signal and selecting both of said first and second memory sectors irrespective of said first set of address signals when said multi-program signal takes an active level so that a data write operation is performed simultaneously on ones of said first and second memory cells selected by said second set of address signals, said control circuit responding to a change of said multi-program signal from said active level to an inactive level to have said first and second inspection circuits output said first signal and said second signal in sequence based on said first set of address signals.

12. The device as claimed in claim 11, wherein said first inspection circuit includes a first latch circuit temporarily storing a data to be written into a selected one of said first memory cells and a first comparison circuit comparing the data stored into said first latch circuit with a data read out from the selected one of said first memory cells to produce said first signal, and said second inspection circuit includes a second latch circuit temporarily storing a data to be written into a selected one of said second memory cells and a second comparison circuit comparing the data stored into said second latch circuit with a data read out from the selected one of said second memory cells to produce said second signal.

13. The device as claimed in claim 12, said device further comprising a first data line coupled in common to said first and second sectors so that the data to be written is transferred through said first data line simultaneously to said first and second latch circuits.

14. The device as claimed in claim 13, said device further comprising a second data line independent from said first data line coupled in common to said first and second comparison circuits so that said first and second signals are transferred onto said second data line in sequence.

15. The device as claimed in claim 13, wherein said first and second signals are transferred onto said first data line in sequence.

16. The device as claimed in claim 13, wherein said first memory sector further includes a third latch circuit temporarily storing the first signal, and said second memory sector further includes a fourth latch circuit temporarily storing the second signal.

* * * * *